(12) United States Patent
Shapovalov et al.

(10) Patent No.: US 9,023,673 B1
(45) Date of Patent: May 5, 2015

(54) FREE HCL USED DURING PRETREATMENT AND ALGAN GROWTH TO CONTROL GROWTH LAYER ORIENTATION AND INCLUSIONS

(71) Applicant: Ostendo Technologies, Inc., Carlsbad, CA (US)

(72) Inventors: Lisa Shapovalov, Gaithersburg, MD (US); Oleg Kovalenkov, Gaithersburg, MD (US); Vladimir Ivantsov, Hyattsville, MD (US); Vitali Soukhoveev, Gaithersburg, MD (US); Alexander Syrkin, Montgomery Village, MD (US); Alexander Usikov, Rockville, MD (US)

(73) Assignee: Ostendo Technologies, Inc., Carlsbad, CA (US)

( * ) Notice: Subject to any disclaimer, the term of this patent is extended or adjusted under 35 U.S.C. 154(b) by 0 days.

(21) Appl. No.: 13/917,373

(22) Filed: Jun. 13, 2013

Related U.S. Application Data

(60) Provisional application No. 61/660,597, filed on Jun. 15, 2012.

(51) Int. Cl.
*H01L 21/00* (2006.01)
*H01L 21/02* (2006.01)

(52) U.S. Cl.
CPC .................................. *H01L 21/0254* (2013.01)

(58) Field of Classification Search
None
See application file for complete search history.

(56) References Cited

U.S. PATENT DOCUMENTS

| 4,144,116 | A * | 3/1979 | Jacob et al. ..................... 117/91 |
| 6,218,269 | B1 | 4/2001 | Nikolaev et al. |
| 6,528,394 | B1 | 3/2003 | Lee |
| 6,559,038 | B2 | 5/2003 | Nikolaev et al. |
| 6,613,143 | B1 | 9/2003 | Melnik et al. |
| 6,632,725 | B2 * | 10/2003 | Trassoudaine et al. ....... 438/479 |
| 6,656,272 | B2 | 12/2003 | Tsvetkov et al. |
| 6,656,285 | B1 | 12/2003 | Melnik et al. |
| 6,660,083 | B2 | 12/2003 | Tsvetkov et al. |
| 6,890,809 | B2 | 5/2005 | Karpov et al. |
| 6,955,719 | B2 | 10/2005 | Dmitriev et al. |
| 6,969,426 | B1 | 11/2005 | Bliss et al. |
| 7,220,324 | B2 | 5/2007 | Baker et al. |
| 7,276,121 | B1 | 10/2007 | Bliss et al. |
| 7,279,047 | B2 | 10/2007 | Melnik et al. |
| 7,621,999 | B2 | 11/2009 | Koukitu et al. |
| 7,670,435 | B2 | 3/2010 | Tsvetkov et al. |
| 7,727,333 | B1 | 6/2010 | Syrkin et al. |

(Continued)

OTHER PUBLICATIONS

Amano, H., et al., "Metalorganic vapor phase epitaxial growth of a high quality GaN film using an AlN buffer layer", *Applied Physics Letters*, vol. 48, No. 5, (Feb. 3, 1986), pp. 353-355.

(Continued)

*Primary Examiner* — Yasser A Abdelaziez
(74) *Attorney, Agent, or Firm* — Blakely Sokoloff Taylor & Zafman LLP

(57) ABSTRACT

A method to grow single phase group III-nitride articles including films, templates, free-standing substrates, and bulk crystals grown in semi-polar and non-polar orientations is disclosed. One or more steps in the growth process includes the use of additional free hydrogen chloride to eliminate undesirable phases, reduce surface roughness, and increase crystalline quality. The invention is particularly well-suited to the production of single crystal (11.2) GaN articles that have particular use in visible light emitting devices.

13 Claims, 6 Drawing Sheets

(56) References Cited

U.S. PATENT DOCUMENTS

| | | | |
|---|---|---|---|
| 7,976,631 | B2 | 7/2011 | Burrows et al. |
| 8,138,069 | B2 | 3/2012 | Melnik et al. |
| 8,840,726 | B2 | 9/2014 | Li et al. |
| 8,841,118 | B2 | 9/2014 | Robinson et al. |
| 2002/0022286 | A1 | 2/2002 | Nikolaev et al. |
| 2002/0155713 | A1 | 10/2002 | Tsvetkov et al. |
| 2002/0177312 | A1 | 11/2002 | Tsvetkov et al. |
| 2003/0013222 | A1 | 1/2003 | Trassoudaine et al. |
| 2003/0049898 | A1 | 3/2003 | Karpov et al. |
| 2004/0137657 | A1 | 7/2004 | Dmitriev et al. |
| 2005/0056222 | A1 | 3/2005 | Melnik et al. |
| 2006/0205199 | A1 | 9/2006 | Baker et al. |
| 2008/0063584 | A1 | 3/2008 | Koukitu et al. |
| 2010/0012948 | A1* | 1/2010 | Usikov et al. ............. 257/76 |
| 2010/0215854 | A1 | 8/2010 | Burrows et al. |
| 2010/0273318 | A1 | 10/2010 | Melnik et al. |
| 2012/0156863 | A1 | 6/2012 | Melnik et al. |

OTHER PUBLICATIONS

Ambacher, O., "Growth and applications of Group III-nitrides", *J. Phys. D: Appl. Phys.*, vol. 31, (1998), pp. 2653-2710.

Baker, Troy J., et al., "Characterization of Planar Semipolar Gallium Nitride Films on Sapphire Substrates", *Japanese Journal of Applied Physics*, vol. 45, No. 6, (2006), pp. L154-L157.

Bohnen, Tim, et al., "Enhanced growth rates and reduced parasitic deposition by the substitution of $Cl_2$ for HCl in GaN HVPE", *Journal of Crystal Growth*, vol. 312, (2010), pp. 2542-2550.

Chengyan, Gu, et al., "Design of a three-layer hot-wall horizontal flow MOCVD reactor", *Journal of Semiconductors*, vol. 33, No. 9, (Sep. 2012), pp. 093005-1 to 093005-5.

Craven, Michael D., et al., "Characterization of a-Plane GaN/(Al,Ga)N Multiple Quantum Wells Grown via Metalorganic Chemical Vapor Deposition", *Japanese Journal of Applied Physics*, vol. 42, Part 2, No. 3A, (Mar. 1, 2003), pp. L235-L238.

Detchprohm, T., et al., "The growth of thick GaN film on sapphire substrate by using ZnO buffer layer", *Journal of Crystal Growth*, vol. 128, (1993), pp. 384-390.

Dwikusuma, F., et al., "X-ray photoelectron spectroscopic study on sapphire nitridation for GaN growth by hydride vapor phase epitaxy: Nitridation mechanism", *Journal of Applied Physics*, vol. 94, No. 9, (Nov. 1, 2003), pp. 5656-5664.

Eastman, Lester F., et al., "The Toughest Transistor Yet", *IEEE Spectrum*, vol. 39, No. 5, (May 2002), pp. 28-33.

Fahle D., et al., "Deposition control during GaN MOVPE", *Materials of CS MANTECH Conference*, May 13-16, 2013, New Orleans, Louisiana, USA, vol. 12, (2013), pp. 399-402.

Fahle, D., et al., "HCL-assisted growth of GaN and AlN", *Journal of Crystal Growth*, vol. 370, (2013), pp. 30-35.

Gu, Shulin, et al., "The impact of initial growth and substrate nitridation on thick GaN growth on sapphire by hydride vapor phase epitaxy", *Journal of Crystal Growth*, vol. 231, (2001), pp. 342-351.

Kang, Sang W., et al., "Prevention of In droplets formation by HCl addition during metal organic vapor phase epitaxy of InN", *Applied Physics Letters*, vol. 90, (2007), pp. 161126-1 to 161126-3.

Kim, S. T., et al., "Growth and Properties of Freestanding GaN Substrates by HVPE Using an AlN Buffer Layer Deposited on Si", *Journal of the Korean Physical Society*, vol. 33, No. 6, (Dec. 1998), pp. 736-740.

Manasevit, H. M., et al., "The Use of Metalorganics in the Preparation of Semiconductor Materials, IV. The Nitrides of Aluminum and Gallium", *J. Electrochem. Soc.*, vol. 118, No. 11, (1971), pp. 1864-1868.

Maruska, H. P., et al., "The Preparation and Properties of Vapor-Deposited Single-Crystal-Line GaN", *Applied Physics Letters*, vol. 15, No. 10, (Nov. 15, 1969), pp. 327-329.

Mastro, M. A., et al., "Influence of polarity on GaN thermal stability", *Journal of Crystal Growth*, vol. 274, (2005), pp. 38-46.

Mastro, M. A., et al., "Thermal Stability of MOCVD and HVPE GaN Layers in $H_2$, HCl, $NH_3$ and $N_2$", *phys. stat. sol. (a)*, vol. 188, No. 1, (2001), pp. 467-471.

Nakamura, Shuji, "GaN Growth Using GaN Buffer Layer", *Japanese Journal of Applied Physics*, vol. 30, No. 10A, (Oct. 1991), pp. L1705-L1707.

Nakamura, Shuji, et al., "The Blue Laser Diode, The Complete Story", Springer-Verlag Berlin Heidelberg New York, (2000), pp. 170-175 & 206-214.

Ng, H. M., "Molecular-beam epitaxy of $GaN/Al_xGa_{1-x}N$ multiple quantum wells on R-plane (10$\bar{1}$2) sapphire substrates", *Applied Physics Letter*, vol. 80, No. 23, (Jun. 10, 2002), pp. 4369-4371.

Nishida, T., et al., "Ten-Milliwatt Operation of an AlGaN-Based Light Emitting Diode Grown on GaN Substrate", *phys. stat. sol. (a)*, vol. 188, No. 1, (2001), pp. 113-116.

Richter, E., et al., "Reactor and growth process optimization for growth of thick GaN layers on sapphire substrates by HVPE", *Journal of Crystal Growth*, vol. 277, (2005), pp. 6-12.

Romanov, A. E., et al., "Strain-induced polarization in wurtzite III-nitride semipolar layers", *Journal of Applied Physics*, vol. 100, (2006), pp. 023522-1 to 023522-10.

Safvi, S. A., et al., "Optimization of Reactor Geometry and Growth Conditions for GaN Halide Vapor Phase Epitaxy", *Mat. Res. Soc. Symp. Proc.*, vol. 423, (1996), pp. 227-232.

Segal, A. S., et al., "Surface chemistry and transport effects in GaN hydride vapor phase epitaxy", *J. Crystal Growth*, vol. 270, (2004), pp. 384-395.

Waltereit, P., et al., "Nitride semiconductors free of electrostatic fields for efficient white light-emitting diodes", *Nature*, vol. 406, (Aug. 24, 2000), pp. 865-868.

Wang, F., et al., "Influences of mask width, fill factor, HCl addition and C doping on wing tilts in the epitaxial laterally overgrown GaN films by hydride vapor phase epitaxy", *Applied Physics Letters*, vol. 80, No. 25, (Jun. 24, 2002), pp. 4765-4767.

Weyers, Markus, et al., "GaN substrates by HVPE", *Proc of SPIE*, vol. 6910, (2008), pp. 691001-1 to 691001-10.

Xiangqian, Xiu, et al., "Effect of Additional HCl and Substrate Nitridation on GaN Films Grown by HVPE", *Chinese Journal of Semiconductors*, vol. 24, No. 11, (Nov. 2003), pp. 1171-1175.

Xiu, X. Q., et al., "Effect of Additional HCl on the Surface Morphology of High Quality GaN on Sapphire by HVPE", *Mat. Res. Soc. Symp. Proc.*, vol. 693, (2002), pp. 135-139.

Yoshida, S., et al., "Epitaxial growth of GaN/AlN heterostructures", *J. Vac. Sci. Technol. B*, vol. 1, No. 2, (Apr.-Jun. 1983), pp. 250-253.

Yoshida, S., et al., "Improvements on the electrical and luminescent properties of reactive molecular beam epitaxially grown GaN films by using AlN-coated sapphire substrates", *Appl. Phys. Lett.*, vol. 42, No. 5, (Mar. 1, 1983), pp. 427-429.

Yoshida, Takehiro, et al., "Ultrahigh-speed growth of GaN by hydride vapor phase epitaxy", *Phys. Status Solidi C*, vol. 8, Issue 7-8, (2011), pp. 2110-2112.

\* cited by examiner

US 9,023,673 B1

FREE HCL USED DURING PRETREATMENT AND ALGAN GROWTH TO CONTROL GROWTH LAYER ORIENTATION AND INCLUSIONS

CROSS-REFERENCE TO RELATED APPLICATIONS

This application claims the benefit of U.S. Provisional Patent Application No. 61/660,597 filed Jun. 15, 2012.

BACKGROUND OF THE INVENTION

1. Field of the Invention

The invention is related to semiconductor materials, methods, and devices, and more particularly, to the growth of and reactor components for the growth of group III-nitride materials by hydride vapor phase epitaxy (HVPE).

2. Prior Art

This application references a number of patents, applications and/or publications. Each of these patents, applications and/or publications is incorporated by reference herein.

The usefulness of gallium nitride (GaN), aluminum nitride, indium nitride, and their ternary and quaternary compounds (AlGaN, InGaN, AlInGaN), collectively known as "group III-nitrides," has been well established for fabrication of visible and ultraviolet optoelectronic devices and high-power electronic devices (see T. Nishida and N. Kobayashi, Phys. Stat. Sol. (a), 188 (1), 113 (2001); S. Nakamura, G. Fasol, and S. J. Pearton, *The Blue Laser Diode*. New York: Springer, 2000; and L. F. Eastman and U. K. Mishra, IEEE Spectrum, 39 (5), 28 (2002)). These devices are typically grown epitaxially by growth techniques including molecular beam epitaxy (MBE) (see S. Yoshida, S. Misawa and S. Gonda, Appl. Phys. Lett. 42 (1983), pp. 427), metalorganic chemical vapor deposition (MOCVD) (see H. M. Manasevit, F. M. Erdmann and W. I. Simpson, J. Electrochem. Soc. 118 (1971), pp. 1864), or hydride vapor phase epitaxy (HVPE) (see H. P. Maruska and J. J. Tietjin, Appl. Phys. Lett. 15 (1969), pp. 327). Among these three techniques, HVPE has the advantage of a high growth rate, which is more than a factor of ten higher than those inherent to MOCVD or MBE, making HVPE most preferable for the growth of thick III-Nitride films, templates, free-standing substrates, and bulk crystals.

Group III-nitrides are most stable in the hexagonal würtzite crystal structure, in which the crystal is described by two (or three) equivalent basal plane axes that are rotated 120° with respect to each other (the a-axes), all of which are perpendicular to a unique c-axis. FIG. 1 is a schematic of a generic non-primitive hexagonal würtzite crystal structure 101 with the $a_1$, $a_2$, $a_3$, and c axes identified therein as blocks 102, 103, 104, and 105, respectively. Using common crystallographic notation, the four principal axes in the wOrtzite structure are parallel to the $[2\bar{1}\bar{1}0]$, $[\bar{1}2\bar{1}0]$, $[\bar{1}\bar{1}20]$, and $[0001]$ directions, respectively.

FIG. 2 illustrates the atomic lattice arrangement of a würtzite group III-nitride crystal. As a consequence of the group III and nitrogen atom positions within the würtzite structure, as one proceeds from plane to plane along the c-axis, each plane will contain only one type of atoms, either group III atoms or N atoms only. In order to maintain charge neutrality, group III-nitride crystals terminate with one c-face that contains only nitrogen atoms (the N-face, block 202), and one c-face that only contains group III atoms (the Ga-face, Al-face, In-face, or group III-face, block 201). Using common Miller-Bravais {hkil} index notation, the polar c-planes can be collectively described by the indices {0001}. More specifically, the metal-terminated c-plane is referred to as the (0001) plane while the nitrogen-terminate c-plane is referred to as the (000$\bar{1}$) plane. Alternate notation for these planes that recognizes the redundancy of the h, k, and i indices is (00.1) and (00.$\bar{1}$) for the metal-terminated and N-terminated c-planes, respectively. As a consequence, group III-nitride crystals are polarized along the c-axis. The spontaneous polarization of these crystals is a bulk property and depends on the structure and composition of the crystal.

The second type of polarization in group III-nitrides is piezoelectric polarization. Piezoelectric polarization occurs when the group III-nitride material experiences a compressive or tensile strain, as can occur when (Al, In, Ga, B)N layers of dissimilar composition (and therefore different lattice constants) are grown in a nitride heterostructure. For example, a thin AlGaN layer on a GaN template will have in-plane tensile strain, and a thin InGaN layer on a GaN template will have in-plane compressive strain, both due to lattice mismatch between the dissimilar composition layers. For an InGaN quantum well grown on a GaN template, the piezoelectric polarization will point in the opposite direction than that of the spontaneous polarization of the InGaN and GaN. For an AlGaN layer grown upon GaN, the piezoelectric polarization will point in the same direction as that of the spontaneous polarization of the AlGaN and GaN. Note that the chemical formula "AlGaN" as used herein refers to any III-nitride composition consisting predominantly of aluminum, gallium, and nitrogen, generally described by the formula $Al_xGa_{1-x}N$ in which $0<x<1$.

One possible approach to eliminating the spontaneous and piezoelectric polarization effects in GaN optoelectronic devices is to grow the devices on non-polar planes of the crystal (see P. Waltereit, O. Brandt, A. Trampert, H. T. Grahn, J. Menniger, M. Ramsteiner, M. Reiche, and K. H. Ploog, Nature (London), 406, 865 (2000); M. D. Craven, P. Waltereit, F. Wu, J. S. Speck, and S. P. DenBaars, Jpn. J. Appl/Phys 42 (3A) 235 (2003); and H. M. Ng, Appl. Phys. Lett., 80 (23) 4369 (2002)). Generally speaking, any crystal plane in the würtzite III-nitride crystal system having indices {hki0}/{hk.0} can be described as a non-polar plane. The two most common non-polar plane orientations are the {11.0} a-planes and {10.0} m-planes (block 203 in FIG. 2). Such planes contain equal numbers of group III and N atoms and are charge-neutral. Furthermore, subsequent non-polar layers are equivalent to one another so the bulk crystal will not be polarized along the growth direction. Growth on electronic devices, such as high electron mobility transistors; or optoelectronic devices, such as visible and ultraviolet laser diodes and light-emitting diodes; in m-plane orientations could yield significantly enhanced device performance compared to equivalent devices grown on c-plane III-nitride planes.

Semi-polar planes represent a third class of crystal orientations that are relevant for the fabrication of III-nitrides, the growth of which were described by Baker et al in U.S. Pat. No. 7,220,324. A semi-polar plane is any crystal plane having at least two non-zero h, k, and/or i Miller-Bravais indices and a non-zero I Miller-Bravais index. Some common examples of semi-polar planes are the {30.1}, {20.1}, {10.1} (block 204 in FIG. 2), {10.2}, {10.3}, and {11.2} (block 205 in FIG. 2) families of planes. The nitride crystal's polarization vector lies neither within such planes or normal to such planes, but rather lies at some angle inclined relative to the plane's surface normal. For example, the {10.1} and {10.3} planes are at 62.98° and 32.06° to the (00.1) c-plane, respectively.

Semi-polar plane group III-nitride devices provide advantageous electronic and optoelectronic properties over conventional c-plane group III-nitride devices by virtue of a reduction in net polarization in the conduction direction of the devices for certain compositions. As described in A. E. Romanov, T. J. Baker, S. Nakamura, J. S. Speck, *J. Appl. Phys.* 100, 023522 (2006), the piezoelectric polarization can offset some or all of the spontaneous polarization for certain combinations of InGaN quantum wells on GaN templates/barriers on particular semi-polar crystal planes. Semi-polar III-nitride devices can therefore offer electrical characteristics that approach those of non-polar III-nitride devices but with unique and oftentimes favorable epitaxy characteristics.

Bulk crystals of single-crystal group III-nitride materials are not readily manufactured so it is impractical or impossible to simply cut a crystal to present a surface for subsequent device regrowth. Commonly, group III-nitride films are initially grown heteroepitaxially, i.e. on foreign substrates that provide a reasonable lattice match to the desired III-nitride material. The heteroepitaxial growth process is commonly carried out with MOCVD, MBE, or HVPE; most typically on substrates consisting of sapphire, silicon carbide, or silicon. Other substrate materials of practical use for group III-nitride heteroepitaxy include, but are not limited to, lithium aluminate, and magnesium aluminate spinel.

The overwhelming majority of III-nitride heteroepitaxy performed today is based on c-plane GaN growth on c-plane sapphire, c-plane silicon carbide, or (111) silicon substrates. Such c-plane GaN growth is imperfect but well-established within the visible optoelectronics and power electronics industries.

High quality GaN films having smooth, mirror-like surfaces have been obtained by MOCVD by incorporating a thin buffer layer into the structure. However, MOCVD is not appropriate for growing thick GaN or other group III-nitride films due to its low growth rate in the order of 1 µm/hour. Due to this reason, HVPE has been utilized in GaN film growth on sapphire substrates in spite of the resulting GaN films typically having a rough surface and poor crystalline characteristics. Attempts to improve the HVPE-grown GaN material quality have utilized aluminum nitride (AlN), zinc oxide (ZnO) or low-temperature GaN films as an interface buffer layer between the sapphire and GaN, similar to buffer layer methodologies developed for MOCVD growth of GaN. However, little distinct quality improvement from the buffer layers has been observed in the resulting GaN films (see H. Amano, N. Sawaki, and Y. Toyada, Appl. Phys. Lett. 48 (1986), pp. 353; S. Nakamura, Jpn. J. Appl. Phys. 30 (1991), pp. 1705; and T. Detchprohm, H. Amano, K. Hiramatsu and I. Akasaki, J. Cryst. Growth 128 (1993), pp. 384).

The problem of poor crystalline quality in heteroepitaxially grown group III-nitrides is particularly acute for semipolar III-nitrides, particularly those for which multiple crystal orientations can readily nucleate on the same substrate (see T. J. Baker, B. A. Haskell, F. Wu, J. S. Speck, and S. Nakamura, Jpn. J. Appl. Phys 45 (6) L154 (2006)). For example, GaN films grown on m-plane sapphire can orient themselves on three different planes, the $\{1\bar{1}00\}$, $\{10.3\}$, and the $\{11.2\}$ planes. Commonly multiple domains of different orientations or rotational senses of these various GaN planes will appear in a single heteroepitaxial film on an m-plane sapphire substrate. For such heteroepitaxially grown III-nitride films to be useful for device fabrication, a means is required to ensure single phase/orientation growth of the III-nitride on the foreign substrate. It is therefore desirable to develop a superior method for the growth of high-quality thick (e.g. 2-100,000 µm) group III-nitride films based on HVPE.

FIG. 3 provides a schematic of a generic HVPE growth chamber 300 as has been described in the prior art. Block 301 depicts a containment vessel, commonly a quartz tube with appropriate end seals to prevent interaction of process gases with the outside atmosphere. Block 302 depicts one or more substrates placed on a susceptor 303, which is located within a heated growth zone of the chamber (304). Adjacent to the growth zone is the source zone of the chamber 305, in which one or more metal supply tubes or vessels 306 charged with metals 307 are located. The metal supply tubes 306 are connected to gas supply lines that are typically isolated from the gas sources 309 by shutoff valves 308. Typical gases that are supplied to the metal sources include HCl and carrier gases (CG) that include, but are not limited to, argon, nitrogen, helium, and hydrogen. The transportation agents of elements of Group V are hydrides (i.e., ammonia) which are brought into the reactor by a separate gas line. The vapor phase (GaCl+NH3) is transported from the source zone towards the growth zone of the reactor as depicted by block 310, where the substrate(s) 302 is/are located, by the carrier gas and process gas. The waste process gas exits the chamber through the process exhaust 311.

The basic chemistry of the group III-nitride HVPE process that occurs in a reactor 300 is described by the expressions in Equations 1-7:

$$HCl_{(g)} + Ga_{(l)} \rightarrow GaCl_{(g)} \tag{1}$$

$$HCl_{(g)} + Al_{(s/l)} \rightarrow AlCl_{(g)} \tag{2}$$

$$HCl_{(g)} + In_{(s/l)} \rightarrow InCl_{(g)} \tag{3}$$

$$NH_3 + GaCl_{(g)} \rightarrow GaN_{(s)} + HCl_{(g)} + H_{2(g)} \tag{4}$$

$$NH_3 + AlCl_{(g)} \rightarrow AlN_{(s)} + HCl_{(g)} + H_{2(g)} \tag{5}$$

$$NH_3 + InCl_{(g)} \rightarrow InN_{(s)} + HCl_{(g)} + H_{2(g)} \tag{6}$$

$$NH_3 + xGaCl_{(g)} + yAlCl_{(g)} + zInCl_{(g)} \rightarrow (Ga_xAl_yIn_z)N_{(s)} + HCl_{(g)} + H_{2(g)} \tag{7}$$

Equations 1-3 describe the formation of gaseous group III monochlorides by flowing hot HCl gas over a group III metal 307 in a metal supply tube or vessel 306. Depending on the temperature at which the formation reactions occur, a metal-trichloride may form as an intermediate product instead of the metal-monochloride. However, such trichlorides typically dissociate at typical group III-nitride HVPE growth temperatures to yield the monochloride that is most active in HVPE growth. The formation reaction typically occurs by flowing HCl gas over a group III source consisting of gallium, aluminum, and/or indium metal, at a temperature ranging from approximately 300° C. to approximately 1100° C. In an appropriately designed metal supply vessel 306 with optimized HCl and carrier gas flows, nearly 100% of the input HCl will react with exposed metal to form the metal monochloride. It should be noted that other halide compounds, including but not limited to hydrogen bromide and hydrogen iodide, are occasionally substituted for hydrogen chloride in the HVPE chemistry. Such substitutions do not fundamentally alter the HVPE growth process from that described herein.

Equations [4-6] describe the growth of simple group III-nitrides in the HVPE process through reaction of group III-monochlorides and ammonia, a group V hydride. Similarly, Equation [7] describes growth of a group III-nitride which can occur over a wide range of temperatures, and is most rapid when the precursors converge at a surface within the HVPE growth chamber. The preferred surface for the reaction to take place is a substrate as depicted by block 302 in FIG. 3.

However, parasitic, or unproductive, deposition of group III-nitrides can occur on virtually any surface with an HVPE growth chamber.

In the method of hydride vapor-phase epitaxy that is often used as a technique of quick growth of GaN and other III-nitrides, the reactors have hot walls as would be provided by the external heaters 304 and 305 to assure the stability of transportation agents of elements of Group III, in the form of GaCl, obtained by reacting gaseous HCl with liquid gallium inside the reactor. For example, in U.S. Pat. No. 6,632,725, adding into the carrier gas a quantity of hydrochloric acid, at a total constant flow under classical negative supersaturation conditions, enables a high growth rate of the epitaxial layer while decreasing and even avoiding the parasitic GaN nucleation or deposition on the walls of the reactor.

In U.S. Pat. No. 7,621,999, $Al_xGa_{1-x}N$ is grown according to the HVPE process in which use is made of an aluminum source, a gallium source, an ammonia source and a carrier gas. In U.S. Pat. No. 6,528,394, a gas mixture of ammonia ($NH_3$) and HCl is used as a treatment for sapphire substrates. This treating of the sapphire substrate by flowing a gas mixture of ammonia and hydrogen chloride onto the substrate was used for modification of substrate surface—not for growing the group III-nitride, because this mixture did not contain any metal chlorides.

US Patent Application Publication No. 2012/0156863 describes exposing a surface of the aluminum oxide containing substrate to a pretreatment gas mixture, wherein the pretreatment gas mixture comprises ammonia and a halogen gas comprising chlorine ($Cl_2$) gas. They use a treatment procedure of treating the substrate by using halogen gas.

While many examples of substrate pretreatment are described in the prior art, none have proven effective for establishing orientation control and enhancing structural quality of semi-polar group III-nitride heteroepitaxially grown films and materials.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

Figure 1:
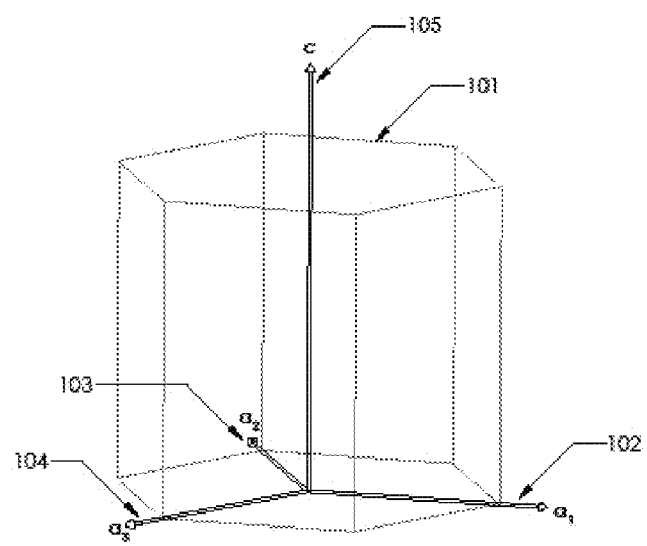
FIG. 1 is an illustration of the hexagonal coordinate system used to describe würtzite III-nitride crystal structures.
Figure 2:
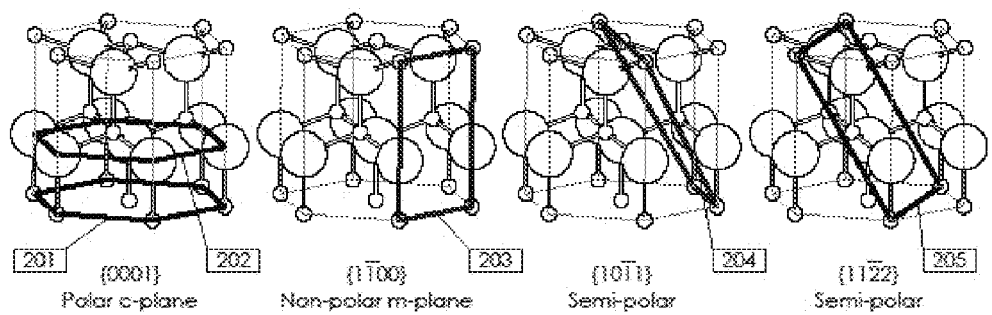
FIG. 2 illustrates the crystal structure of a group III-nitride material, and identifies major crystal planes of interest.
Figure 3:
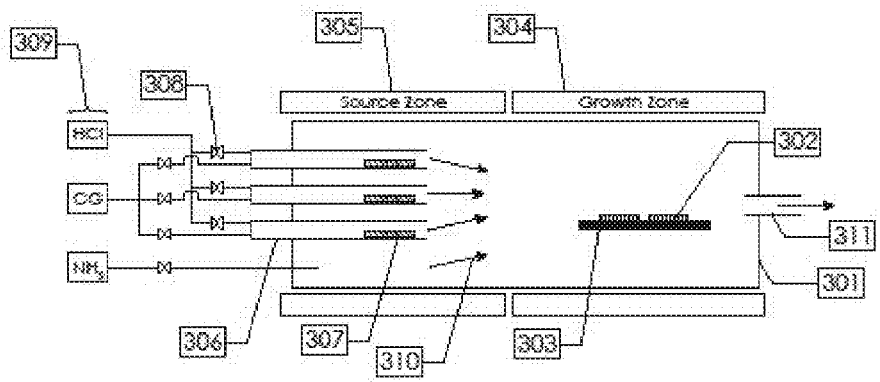
FIG. 3 provides a schematic representation of an HVPE crystal growth chamber/reactor as could be found in the prior art.

The present invention addresses the deficiencies in the prior art and provides a means to effectively control the orientation of a group III-nitride that grows upon a foreign substrate. The invention provides further benefit to the growth of III-nitrides of many orientations in that it leads to reduced microstructural and macroscopic defect densities, even when the invention is not required for orientation control. Another benefit of the present invention is the achievement of reduced surface roughness in group III-nitride thin films, thick films, and bulk material. Additionally, the invention can extend the lifetime of HVPE growth chamber components and improve run-to-run reproducibility by reducing parasitic deposition within the growth chamber.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

The present invention provides a method for growing a group III-nitride article, which includes the introduction of additional free, unreacted HCl (referred to herein as "free HCl" or "HCl")+in growth procedure that includes: treatment of initial substrate, seed layer formation and growth of AlN and AlGaN layers, followed by growth of the desired group III-nitride composition. In the present invention method the separately injected free HCl inhibits growth of less favorable group III-nitride orientations, such as (10.3) AlN/GaN/AlGaN when (11.2) AlN/GaN/AlGaN is desired or (00.1) AlN/GaN/AlGaN when (10.0) AlN/GaN/AlGaN is desired. Free HCl is used in one or more steps of the group III-nitride growth sequence to achieve the desired phase purity and improved structural quality.

The invention is utilized to produce a group III-nitride article, which is to be understood to represent any thin or thick film of group III-nitride material, including bulk crystals of said III-nitride material whether grown on a planar substrate or on a three-dimensional surface. Products that could be considered group III-nitride articles include thin film heteroepitaxially-grown templates, thick film heteroepitaxially grown templates, homoepitaxially grown layers, free-standing layers and films, and bulk crystals. The use of the term "group III-nitride article" is for convenience and is not intended to limit the scope of the products produced with the method described herein.

In the description of the preferred embodiment that follows, reference will be made to specific group III-nitride compositions, such as AlN, AlGaN, and GaN. Use of such specific compositions is made for convenience and clarity and is not intended to limit the invention's applicability to the growth of other group III-nitride compositions. For example, the desired group III-nitride article described in the preferred embodiment is predominantly GaN. However, the invention is equally applicable to the growth of a group III-nitride article that is predominantly AlN, AlGaN, or InGaN (AlInGaN generally), by way of examples. Also it should be noted that references to AlGaN, InGaN or AlInGaN refer to such compositions generally, and equally apply to all ratios of Al, In and Ga in such compositions, as applicable.

The preferred embodiment illustrates the use of HVPE as the growth method for the entire process comprising the invention. One skilled in the art will recognize that either individual steps or the entire process described herein could be executed with suitably designed growth systems based on other deposition technologies, including MOCVD, hybrid HVPE-MOCVD, and plasma-based methods. The use of HVPE in the preferred embodiment is not intended to limit the scope of the present invention.

The invention further comprises a series of process steps related to the treatment of a substrate and growth of III-nitride materials. One skilled in the art will recognize that the choice of substrate may impact the necessity of execution of some steps, and that omission of steps described herein may be acceptable while practicing the invention. For example but without limitation, if the starting substrate is a GaN substrate, and the desired group III-nitride article is also a GaN substrate, then the substrate treatment and nucleation steps can be omitted from the process without adversely affecting the performance of subsequent steps. Such omissions of steps are consistent with the practice of the invention. One skilled in the art will further recognize that insertion of additional steps before, during, or after the process described herein lies within the scope of the invention. For example, it may be desirable to perform a substrate cleaning or etching step prior to the substrate treatment step. Such an additional step can be included in the process without fundamentally altering the invention itself.

Figure 5:
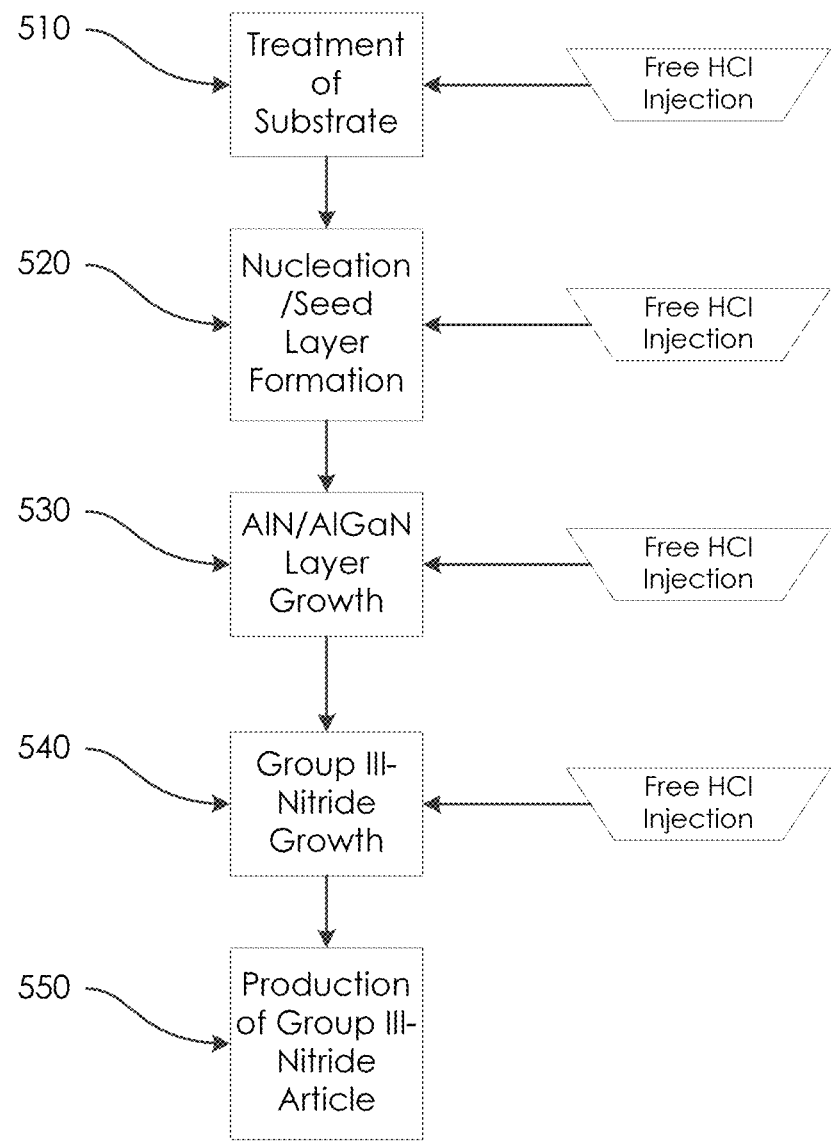
FIG. 5 is a flow chart illustrating the steps in the preferred embodiment of the inventions.
Figure 6:
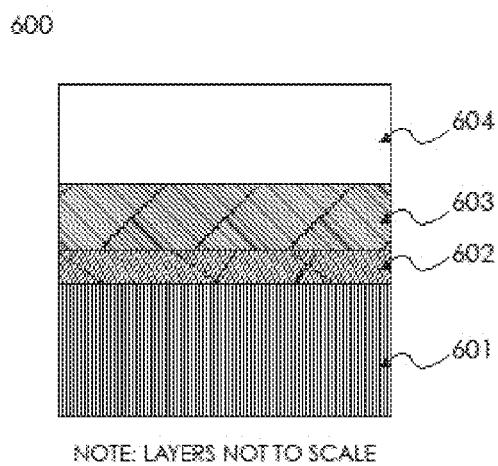
FIG. 6 provides a schematic view of the layer structure of a group III-nitride article produced via the preferred embodiment.

FIG. 5 provides a flow diagram illustrating the preferred embodiment, which describes the growth of a group III nitride article consisting of predominantly (11.2)-oriented GaN grown on an (10.0) m-plane sapphire substrate, though any $Al_xIn_yGa_{(1-x-y)}N$ article may be grown, where x and y can range from 0 to 1. The invention consists of the following steps: substrate treatment/conditioning (Block 510), nucleation/seed layer formation (Block 520), AlN and/or AlGaN layer growth (Block 530), and group-III nitride growth (Block 540). The end product of the process is a group III-nitride article (Block 550), which is shown in detail in FIG. 6 as block 600 as well. In one or more of steps 510 through 540, free HCl is injected into the growth chamber to modify the chemistry over the substrate. Each of the steps is described in detail below with reference to FIG. 5 and FIG. 6.

Step 510: Substrate Treatment. The substrate 601 is optionally nitridated (and annealed) via exposure to $NH_3$ at a high temperature (600° C. to 1250° C., and more preferably 900° C. to 1100° C., and most preferably 900° C. to 1050° C.) either before or after being exposed to a gas stream that contains a fraction of aluminum chloride and a fraction of free HCl. If the total chloride-containing gas is assumed to be the sum of the AlCl and free HCl flows, the free HCl percentage of the total chloride containing gas should range from approximately 3% to approximately 70%. The most preferable percentage of free HCl will vary based on HVPE chamber geometry, carrier gas flow rates and partial pressures, and presence of other chloride species such as GaCl. Most preferably, the free HCl percentage should be between approximately 10% and approximately 20% for the growth of a group III-nitride article consisting predominantly of (11.2) GaN.

Step 520: Nucleation Layer Deposition. The nucleation layer 602 typically consists of a thin AlN layer ranging from approximately 1 nm to approximately 100 nm. Other compositions of nucleation layers are acceptable, however, including $Al_xGa_{1-x}N$ where 0<x<1, GaN, InN, $In_xGa_{1-x}N$ where 0<x<1, and $In_xAl_yGa_{1-x-y}N$ where 0≤x, y≤1. For nucleation, typically HCl is fed to an aluminum source to form AlCl, NH3, free HCl (HCl that is not reacted with the aluminum), and carrier gas ($H_2$, $N_2$, Argon, etc.). The free HCl percentage of total chlorides should range from approximately 3% to approximately 70%, with similar factors affecting the most preferable free HCl percentage as in step 510. Most preferably, the free HCl percentage should be between approximately 10% and approximately 20% for the growth of a group III-nitride article consisting predominantly of (11.2) GaN. All percentages of HCl in the total chloride bearing gases stated herein are expressed as percentages by volume.

Step 530: AlGaN Growth. One or more AlGaN layers 603 are typically grown on the substrate having compositions ranging from approximately 5% Ga to approximately 95% Ga. The AlGaN Growth step may consist of a single composition of AlGaN, multiple AlGaN layers of dissimilar composition, or one or more continuously graded compositions of AlGaN ranging from predominantly AlN to predominantly GaN. In one embodiment, the present invention provides a method of growing several intermediate AlGaN layers on the treated sapphire prior to the growth of (11.2) or (10.0) GaN. The intermediate layers serve several purposes, but the main purpose is to control the growth orientation uniformly across the wafer, so that the intended semi-polar, or non-polar orientations of GaN can be grown free of (10.3) GaN inclusions or domains.

The total chloride-containing gas in this step 530 is the sum of the AlCl, GaCl, and free HCl directed towards the substrate. In the preferred embodiment, the free HCl percentage should range from approximately 25% to approximately 95% depending on the considerations outlined for Step 510. For the growth of a group III-nitride article consisting predominantly of (11.2) GaN, the free HCl percentage should most preferably be in the range of approximately 45% to approximately 75% of the total chloride-containing gases.

Step 540: Group III-Nitride Growth. This step involves the growth of a group III-nitride film, layer, or bulk material 604 on the underlying substrate and/or template layers. Most commonly, the group III-nitride growth will be the longest step yielding the greatest thickness of deposited material. The group III-nitride can consist of any composition of $In_xAl_yGa_{1-x-y}N$ where 0≤x, y≤1, or may consist of multiple compositions of group III-nitrides. The total chloride-containing gas in this step 530 is the sum of the InCl, AlCl, GaCl, and free HCl directed towards the substrate. In the preferred embodiment, the free HCl percentage should range from approximately 0% to approximately 75% depending on the considerations outlined for Step 510. For the growth of a group III-nitride article consisting predominantly of (11.2) GaN, the free HCl percentage should most preferably be in the range of approximately 25% to approximately 50% of the total chloride-containing gases.

Step 550: Production of a Group III-Nitride Article (Block 600). This step essentially involves cooling the group III-nitride material grown in the previous steps to room temperature and removing it from the growth chamber. Typically no additional deposition occurs in this step, as it represents the end product of the process described herein.

The free HCl utilized in the steps illustrated in FIG. 5 can be introduced to the growth chamber in two ways. In the first method, the metal supply source is designed such that, for the intended HCl flow over or through the source, a fraction of the HCl injected into the metal supply source fails to react with the metal to form metal chlorides. For example, a gallium metal supply source could be designed with limited surface area relative to the intended HCl flow such that approximately 20% of the injected HCl passes through the metal supply source as free HCl while approximately 80% of the HCl reacts with the gallium metal to form GaCl. Generally speaking, as the surface area of metal exposed in the metal supply source increases, more HCl can be injected into the source while maintaining close to 100% reaction efficiency between the HCl and metal. One skilled in the art will recognize that many combinations of metal supply source geometry and HCl flows can be utilized to generate free HCl within the scope of the present invention. It must also be understood that the reaction efficiency between HCl and the metal in the metal supply source further depends on the total gas flow velocity within the source, which is impacted by carrier gas partial pressure and HVPE chamber pressure. As the gas velocity in the metal source increases, the residence time of HCl in the vicinity of the group III metal will decrease, and a larger fraction of HCl will remain unreacted. One skilled in the art will recognize that many variations of total gas flows, pressures, and velocities through one or more metal sources may be utilized in the practice of this invention.

Figure 4:
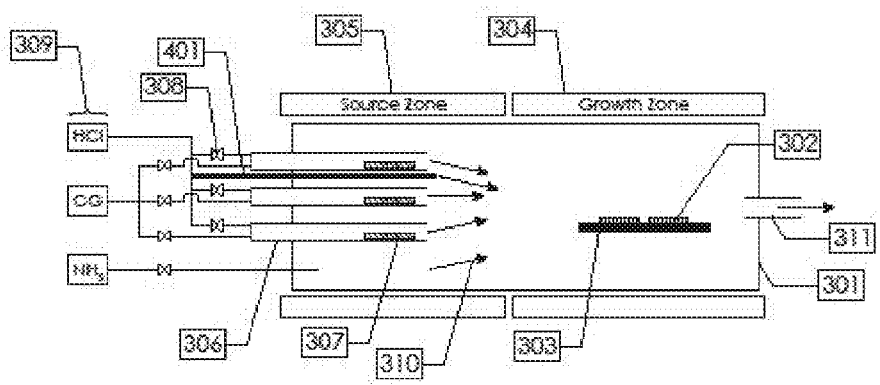
FIG. 4 illustrates a modified HVPE crystal growth reactor with added Free HCl injection capability.

A second method for delivery of the free HCl into the growth chamber is by metering additional HCl into the chamber independently of the HCl injected into the metal supply sources. This method is illustrated in FIG. 4, in which block 401 represents an additional HCl line that connects the HCl supply to the growth chamber. High purity valves and mass flow controllers are typically included on this free HCl injection line to precisely meter HCl into the chamber. It is often advantageous to design the metal supply sources in the growth chamber to achieve near 100% reaction efficiency between HCl and the metal contained therein to maximize process stability. Incorporation of an additional HCl line to inject free HCl into the chamber allows the metal supply sources to be precisely saturated with HCl while also allowing the practice of the invention and achievements of the improvements in group III-nitride phase purity and smoothness that result.

Figure 7:
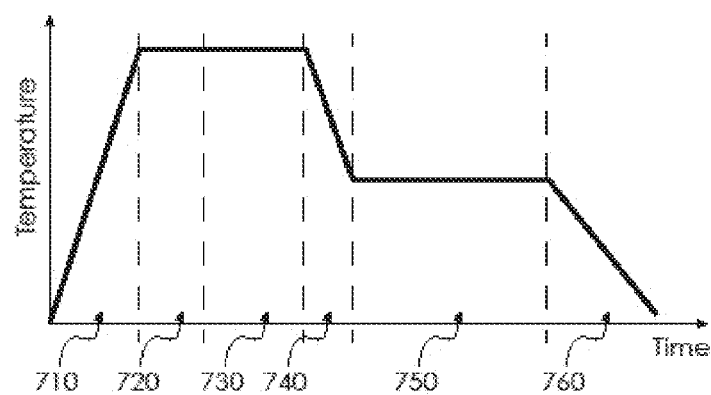
FIG. 7 is a temperature-time diagram of the preferred embodiment as applied to the growth of a (11.2) GaN group III-nitride article.

FIG. 7 illustrates a typical time-temperature diagram for the preferred embodiment showing that the early steps of the process are typically executed at elevated temperatures, equal to or hotter than the subsequent group III-nitride growth. Block 710 represents warming the growth chamber from room temperature or thereabouts to the initial treatment temperature represented by block 510 in FIG. 5. Blocks 720 and 730 represent the temperature at which steps 520 and 530 are executed, respectively. Though in the preferred embodiment these steps are executed at the same temperature, in alternate embodiments it may be desirable to change the substrate temperature between steps 520 and 530. Block 740 represents an adjustment in chamber temperature prior to the group III-nitride growth step 540. In the preferred embodiment, the temperature of the chamber is lowered between these steps, but in alternate embodiments it may be preferable to maintain constant temperature or increase the temperature for step 540 relative to that used for step 530. Block 750 represents the temperature at which the group III-nitride growth occurs. Block 760 represents cooling the chamber to the unloading temperature for retrieval of the group III-nitride article 600.

The present invention provides several advantages over the prior art with respect to group III-nitride article creation, particularly for (11.2) GaN article creation. First, there is no low temperature buffer layer required, which was commonly used to solve the issue with lattice mismatch between a sapphire substrate and a GaN film grown thereon. Such low-temperature buffers as described in the prior art are difficult to control and represent a significant source of yield loss. However, the invention can be practiced such that the steps described in FIG. 5 can follow a low-temperature buffer deposition step if so desired. Alternately, a low-temperature buffer step could be inserted into the process between steps 510 and 520.

Figure 8:
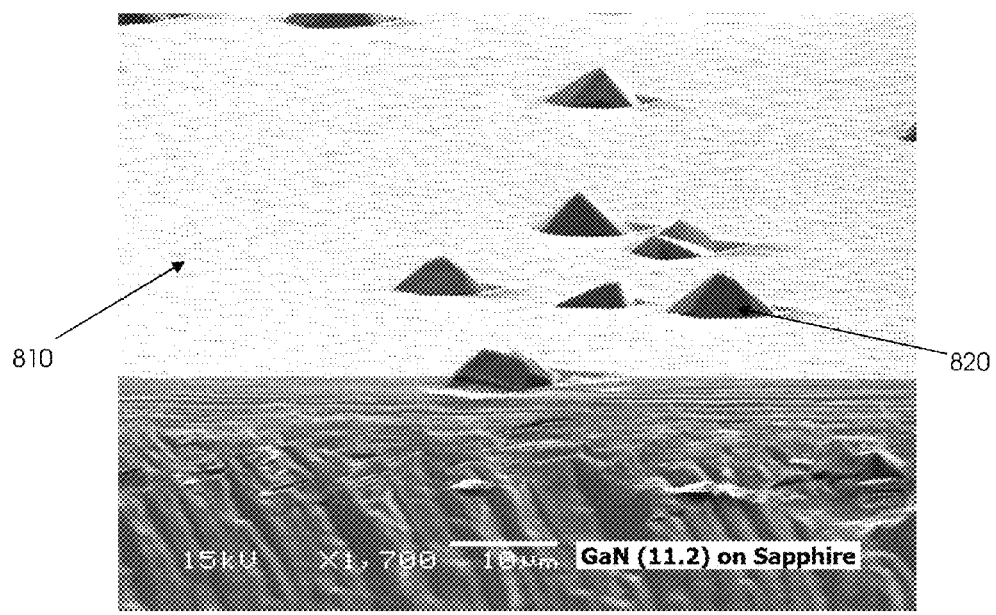
FIG. 8 is a cross-sectional scanning electron micrograph revealing (10.3) inclusions in (11.2) GaN grown without use of the present invention.
Figure 9:
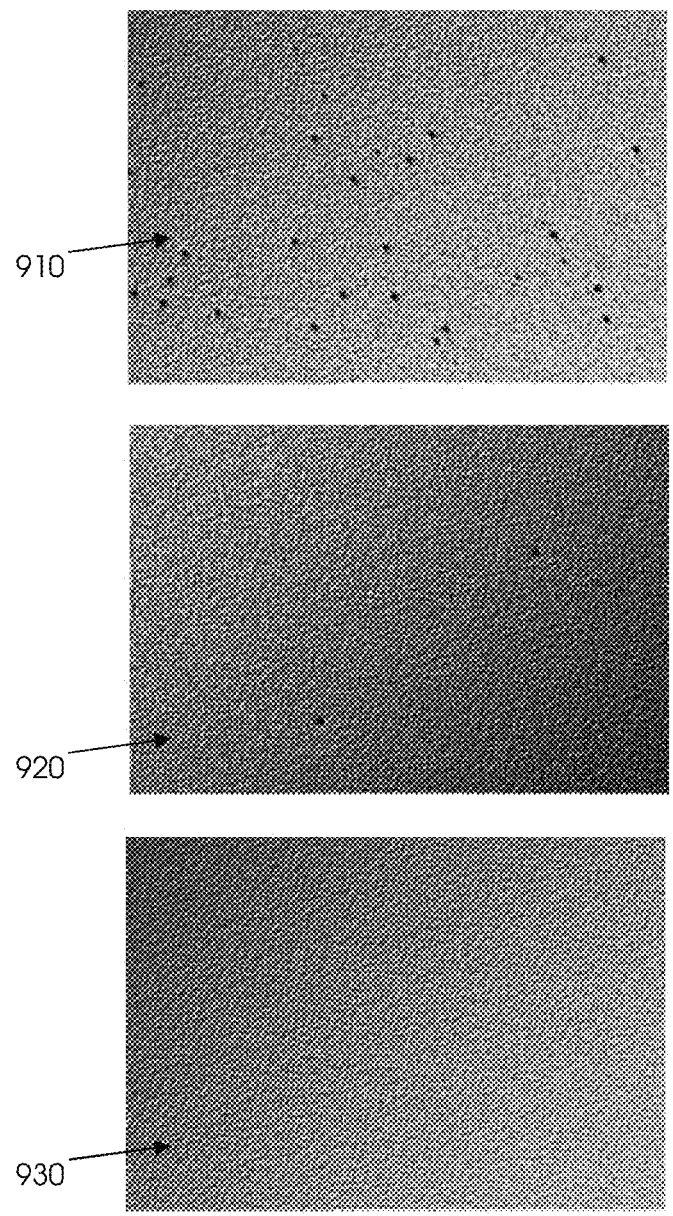
FIG. 9 is a collection of plan view Nomarski optical micrographs illustrating the improvements in surface morphology and reduction in inclusion density achieved with the invention in (11.2) GaN films.

Second, by treating the surface of the sapphire substrate with AlCl and free-HCl, a high-quality GaN film with a mirror surface can be obtained by using the HVPE, at a high growth rate in the range of about 30-50 μm/hour. FIGS. 8 and 9 illustrate the elimination of inclusions and other surface defects achieved through the practice of the invention. FIG. 8 provides a cross-sectional scanning electron micrograph of a (11.2) GaN film (block 810) that was grown without the present invention. One can see the presence of (10.3)-oriented inclusions (block 820) within the film. These inclusions appear as dark dots in the plan view Nomarksi optical micrographs shown in FIG. 9.

Block 910 in FIG. 9 shows an optical micrograph of a (11.2) GaN films grown without the present invention. Numerous dark spots in the image indicate the presence of undesirable inclusions. Block 920 shows an optical micrograph of a (11.2) GaN film that incorporated the present invention but with insufficient free HCl to completely eliminate inclusions from the film. Block 930 shows an optical micrograph of a (11.2) GaN film that incorporated the present invention with optimized free HCl to eliminate inclusions and achieve a phase-pure semi-polar group III-nitride article.

The group III-nitride article thus produced using the invention is a superior template or substrate for the subsequent production of a wide range of high-performance optoelectronic and power electronic devices, including but not limited to group III-nitride-based laser diodes, light emitting diodes, and transistors. The invention can be further incorporated into the production of n-type and p-type doped group III-nitride templates for some applications. The invention is also compatible with incorporation of other dopants including but not limited to carbon, magnesium, silicon, oxygen, zinc, iron, and europium, in the production of specialized templates for both optoelectronic and electronic device fabrication.

What is claimed is:

1. A method for growing a group III-nitride article on a substrate comprising a) substrate treatment including exposure of the substrate to a gas mixture containing at least a fraction of aluminum chloride and a fraction of free hydrogen chloride, b) nucleation layer formation, c) AlGaN intermediate layer growth, and d) group III-nitride layer growth; wherein either or both of c) and d) includes hydrogen chloride in a gas stream, the group III-nitride article being grown in a semi-polar direction.

2. The method of claim 1 wherein the group III-nitride layer growth is in a gas stream containing at least one of AlCl and GaCl, the hydrogen chloride being at least 25% of the total chloride containing gas.

3. The method of claim 1 wherein the group III-nitride layer growth is in a gas stream containing at least one of AlCl and GaCl, and the hydrogen chloride is in the range of 45 approximately to approximately 75% of the total chloride containing gas.

4. The method of claim 1 wherein the nucleation layer formation is in a gas stream containing chlorides, and the hydrogen chloride is in the range of approximately 3% to approximately 70% of the total chloride containing gas.

5. The method of claim 1 wherein the nucleation layer formation is in a gas stream containing chlorides, and the hydrogen chloride is in the range of approximately 10% to approximately 20% of the total chloride containing gas.

6. The method of claim 1 wherein for the group III-nitride layer growth is in a chloride containing gas stream and wherein the HCl is in the range of approximately 0% to approximately 75%.

7. The method of claim 1 wherein for the group III-nitride layer growth is in a chloride containing gas stream and wherein the HCl is in the range of approximately 25% to approximately 50% of the total chloride containing gas.

8. The method of claim 1 wherein the group III-nitride article is a {11.2}-oriented film consisting predominantly of GaN on an m-plane sapphire substrate.

9. The method of claim 8 for growing a semi-polar group III-nitride article wherein high temperature nitridation in $NH_3$ flow is used for substrate treatment.

10. The method of claim 8 for growing a semi-polar group III-nitride article wherein {11.2} AlGaN is grown as a buffer layer on the treated sapphire substrate.

11. The method of claim 10 wherein aluminum chloride, gallium chloride, ammonia and free hydrogen chloride are mixed with a carrier gas to grow an {11.2}-oriented AlGaN layer while suppressing non-{11.2} orientations from forming.

12. The method of claim 8 for growing a semi-polar group III-nitride article wherein the substrate is nitridated with a gas flow including ammonia during the substrate treatment step.

13. The method of claim 8 for growing a semi-polar group III-nitride article wherein gallium chloride, ammonia, and additional free-HCl are mixed with carrier gases to grow {11.2} GaN while suppressing formation of non-{11.2} orientations.

\* \* \* \* \*